United States Patent
Ufert et al.

(10) Patent No.: US 7,741,630 B2
(45) Date of Patent: Jun. 22, 2010

(54) RESISTIVE MEMORY ELEMENT AND METHOD OF FABRICATION

(75) Inventors: Klaus-Dieter Ufert, Unterschleissheim (DE); Josef Willer, Riemerling (DE)

(73) Assignee: Qimonda AG, Munich (DE)

( * ) Notice: Subject to any disclaimer, the term of this patent is extended or adjusted under 35 U.S.C. 154(b) by 70 days.

(21) Appl. No.: 12/028,513

(22) Filed: Feb. 8, 2008

(65) Prior Publication Data
US 2009/0200533 A1    Aug. 13, 2009

(51) Int. Cl.
*H01L 47/00* (2006.01)
(52) U.S. Cl. ............. 257/2; 257/E21.001; 257/E47.001
(58) Field of Classification Search ...................... 257/2, 257/E21.001, E47.001
See application file for complete search history.

(56) References Cited

U.S. PATENT DOCUMENTS

| | | | |
|---|---|---|---|
| 2005/0073803 A1* | 4/2005 | Cho | 361/306.1 |
| 2006/0170027 A1 | 8/2006 | Lee et al. | |
| 2006/0220108 A1* | 10/2006 | Hashimoto | 257/330 |
| 2007/0007571 A1 | 1/2007 | Lindsay et al. | |
| 2007/0075361 A1 | 4/2007 | Luyken et al. | |

FOREIGN PATENT DOCUMENTS

DE    10 2005 047 058 A1    4/2007
DE    10 2006 023 609 A1    11/2007

OTHER PUBLICATIONS

Gibbons, et al., "Switching Properties of Thin NiO Films*," Solid-State Electronics, Mar. 30, 1964, pp. 785-797, vol. 7, Pergamon Press, Great Britain.
Hiatt, et al., "Bistable Switching in Niobium Oxide Diodes[1]," Applied Physics Letters, Mar. 15, 1965, pp. 106-108, vol. 6, No. 6, American Institute of Physics, Melville, NY.
Argall, "Switching Phenomena in Titanium Oxide Thin Films," Solid-State Electronics, Jul. 27, 1968, pp. 535-541, vol. 11, Pergamon Press, Great Britain.
Baek, et al., "Highly Scalable Non-volatile Resistive Memory using Simple Binary Oxide Driven by Asymmetric Uni-polar Voltage Pulses," International Electron Devices Meeting, 2004, 26 pages, Samsung Electronics Co., Ltd., Korea.
Seo, et al., "Reproducible Resistance Switching in Polycrystalline NiO Films," Applied Physics Letters, Dec. 6, 2004, pp. 5655-5657, vol. 85, No. 23, American Institute of Physics, Melville, NY.
Seo, et al., "Conductivity Switching Characteristics and Reset Currents in NiO Films," Applied Physics Letters, Feb. 25, 2005, pp. 3509-3511, vol. 86, No. 9, American Institute of Physics, Melville, NY.

* cited by examiner

Primary Examiner—Tan N Tran

(57) ABSTRACT

An integrated circuit including a memory cell and a method of manufacturing the integrated circuit are described. The memory cell includes a buried gate select transistor and a resistive memory element coupled to the buried gate select transistor. The resistive memory element stores information based on a resistivity of the resistive memory element.

14 Claims, 7 Drawing Sheets

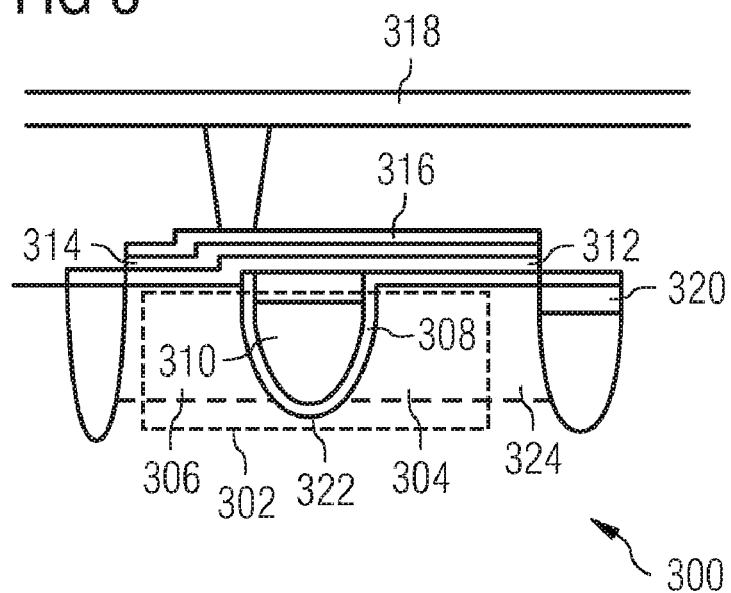
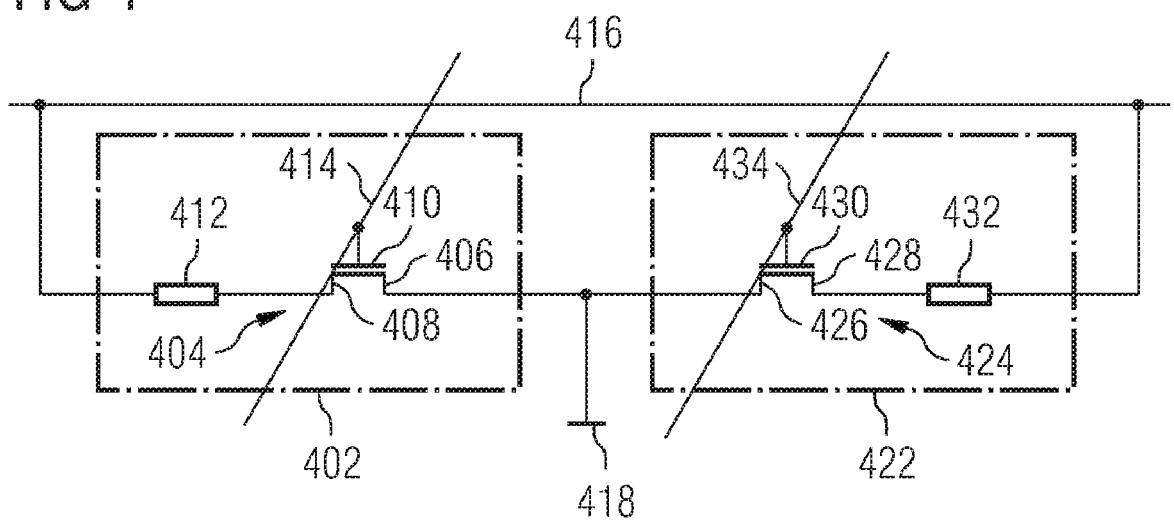

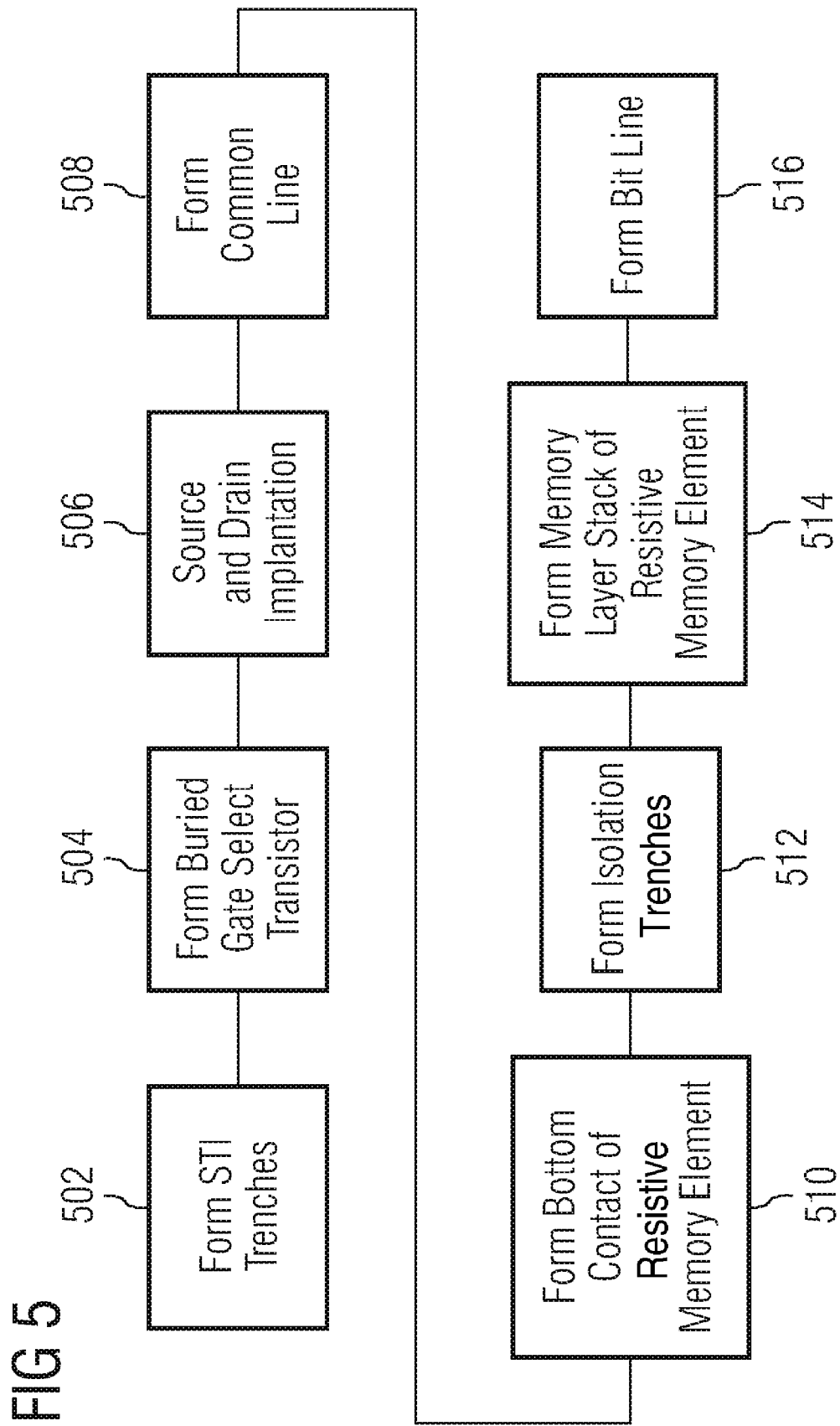

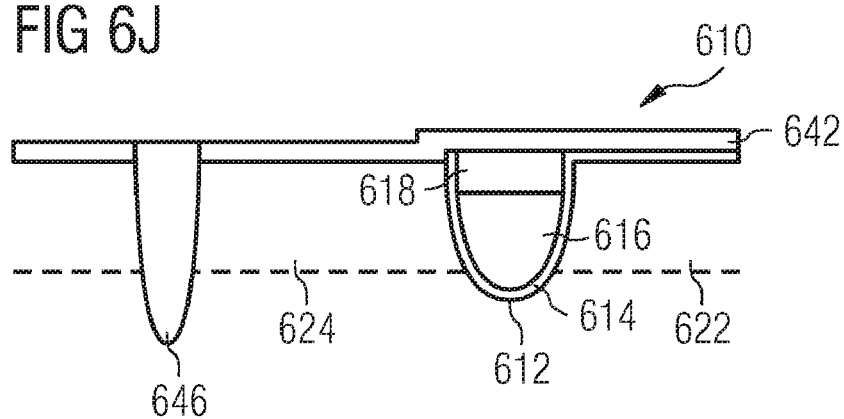
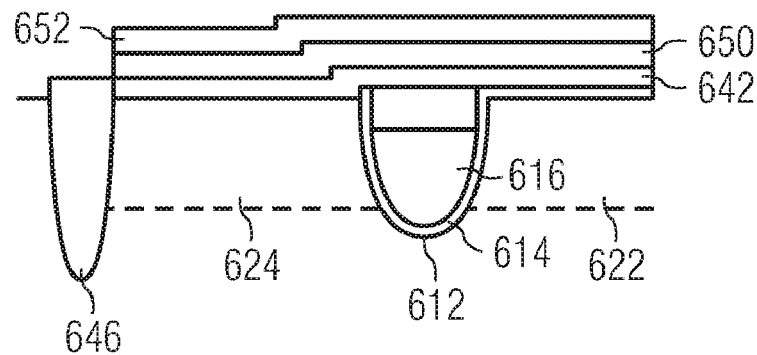
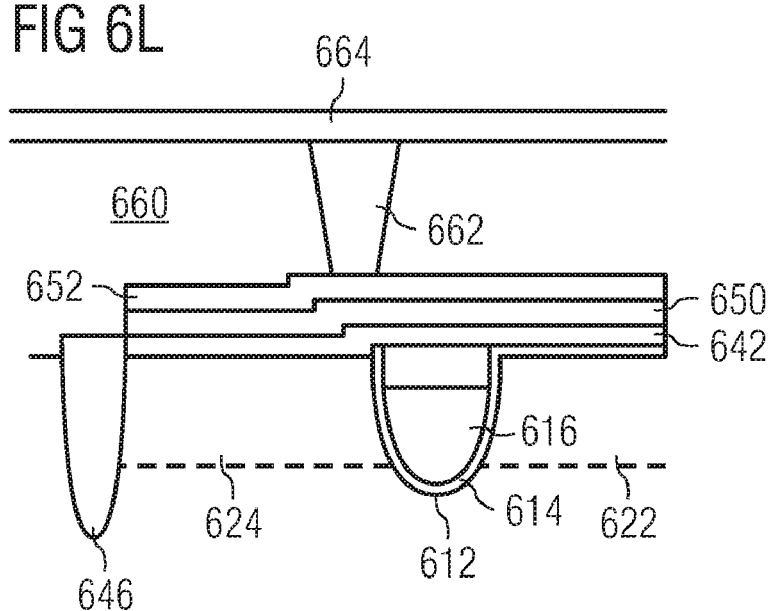

RESISTIVE MEMORY ELEMENT AND METHOD OF FABRICATION

BACKGROUND

Memory devices are used in essentially all computing applications and in many electronic devices. For some applications, non-volatile memory, which retains its stored data even when power is not present, may be used. For example, non-volatile memory is typically used in digital cameras, portable audio players, wireless communication devices, personal digital assistants, and peripheral devices, as well as for storing firmware in computers and other devices.

A wide variety of memory technologies have been developed. Non-volatile memory technologies include flash memory, magnetoresistive random access memory (MRAM), phase change random access memory (PCRAM), conductive bridging random access memory (CBRAM), and carbon memory. Due to the great demand for memory devices, researchers are continually improving memory technology, and developing new types of memory, including new types of non-volatile memory.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a resistive memory cell with a buried gate transistor, in accordance with an embodiment of the invention;

FIG. 4 shows a schematic representation of two resistive memory cells, in accordance with an embodiment of the invention;

FIG. 5 is a block diagram of a method for manufacturing an integrated circuit memory device in accordance with an embodiment of the invention;

FIGS. 6A-6L show views of an integrated circuit memory device in accordance with an embodiment of the invention at various stages of the manufacturing process.

DETAILED DESCRIPTION OF ILLUSTRATIVE EMBODIMENTS

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information.

In accordance with some embodiments of the invention, one such technology is a resistive memory based on the bistable resistance change in transition metal oxide layers. As will be described below, in certain transition metal oxide materials, in response to the application of an adequate voltage, a conductive path or filament may be formed or removed within the material, due to thermal electronic exchange effects. The formation and removal of this conductive filament is coupled with a thermistor effect, which induces the bistable switching process, due to the inhomogeneous temperature distribution in the transition metal oxide material in response to the application of a voltage.

Among the transition metal chalcogenides, NiO is of particular interest for this application, due to its large band gap of approximately 4.5 eV. At room temperature, NiO in its stoichiometric state is a good isolating semiconductor, which forms its relatively large band gap by means of hybridization of relatively strongly localized 3d electrons with O 2p electron bands. Additionally, NiO has a region with negative differential resistance and monostable switching in the current-voltage (I-U) characteristic due to the steepness of its resistance-temperature characteristic in response to the application of an appropriate voltage due to the thermistor effect ($\sigma \sim e^{-\Delta E/kT}$).

Figure 1A:
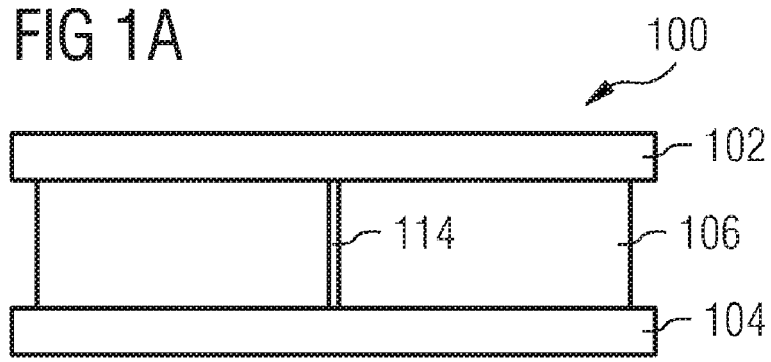
FIGS. 1A and 1B show a resistive memory element in which a conductive filament is formed through a transition metal oxide layer.

FIG. 1A shows a resistive memory element 100 of the type discussed above, suitable for use in some embodiments of the invention. The resistive memory element 100 includes a top contact 102, a bottom contact 104, and a transition metal oxide switching layer 106 located between the top contact 102 and the bottom contact 104. The transition metal oxide switching layer 106 may include any of a number of transition metal compounds, such as NiO, $TiO_2$, $HfO_2$, $ZrO_2$, $Nb_2O_5$, $Ta_2O_5$, or other suitable materials.

When a voltage above a "SET" voltage is applied across the transition metal oxide switching layer 106, a conductive filament 114 is formed within the layer, placing the resistive memory element 100 in an "ON" state by dramatically reducing the resistance of the transition metal oxide switching layer 106. For example, a SET voltage of approximately 2V applied across an NiO film with a thickness between approximately 20 nm and approximately 100 nm may cause the resistance of the film to drop from approximately 1 KΩ to 10 KΩ (depending on the thickness of the layer) to less than approximately 100Ω.

Figure 1B:
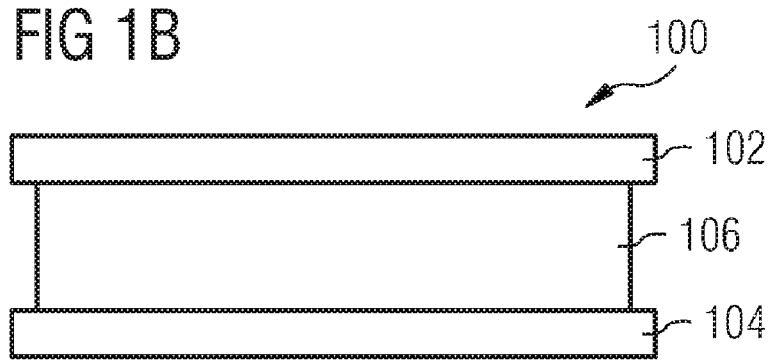

As shown in FIG. 1B, when a "RESET" voltage is applied across the transition metal oxide switching layer 106 in the "ON" state, the conductive filament 114 is removed, returning the resistive memory element 100 to an "OFF" state, and increasing the resistance of the transition metal oxide switching layer 106. The "RESET" voltage for use with a transition metal oxide layer including an NiO film may be approximately 1V.

To determine the current memory state of the resistive memory element 100, a sensing current may be routed through the resistive memory element 100. The sensing current encounters a high resistance if no filament 114 exists within the resistive memory element 100, and a low resistance when a filament 114 is present. A high resistance may, for example, represent "0", while a low resistance represents "1", or vice versa.

Figure 2A:
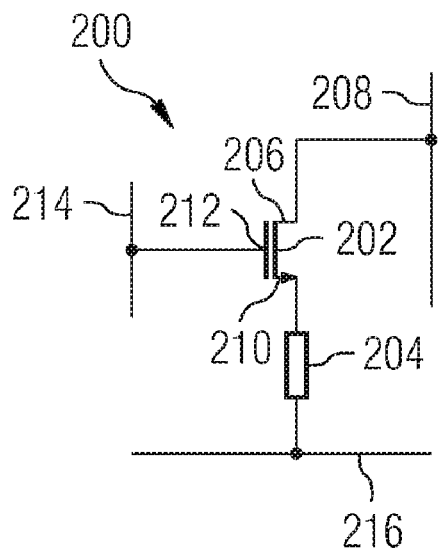
FIGS. 2A and 2B show alternative block diagram layouts of a memory cell using a resistive memory element.

FIG. 2A shows an illustrative memory cell that uses a resistive memory element, suitable for use in accordance with some embodiments of the invention. The memory cell 200 includes a select transistor 202 and a resistive memory element 204. The select transistor 202 includes a source 206 that is connected to a bit line 208, a drain 210 that is connected to the memory element 204, and a gate 212 that is connected to a word line 214. The resistive memory element 204 is also connected to a common line 216, which may be connected to ground, or to other circuitry, such as circuitry (not shown) for determining the resistance of the memory cell 200, for use in reading. Alternatively, in some configurations, circuitry (not shown) for determining the state of the memory cell 200 during reading may be connected to the bit line 208. It should be noted that as used herein the terms connected and coupled are intended to include both direct and indirect connection and coupling, respectively.

To write to the memory cell, the word line 214 is used to select the cell 200, and a voltage on the bit line 208 is applied through the resistive memory element 204, to form or remove a conductive path or filament in the resistive memory element 204, changing the resistance of the resistive memory element 204. Similarly, when reading the cell 200, the word line 214 is used to select the cell 200, and the bit line 208 is used to apply a reading voltage across the resistive memory element 204 to measure the resistance of the resistive memory element 204.

The memory cell 200 may be referred to as a 1T1J cell, because it uses one transistor, and one memory junction (the resistive memory element 204). Typically, a memory device will include an array of many such cells. It will be understood that other configurations for a 1T1J memory cell, or configurations other than a 1T1J configuration may be used with a resistive memory element. For example, in FIG. 2B, an alternative arrangement for a 1T1J memory cell 250 is shown, in which a select transistor 252 and a resistive memory element 254 have been repositioned with respect to the configuration shown in FIG. 2A.

Figure 2B:
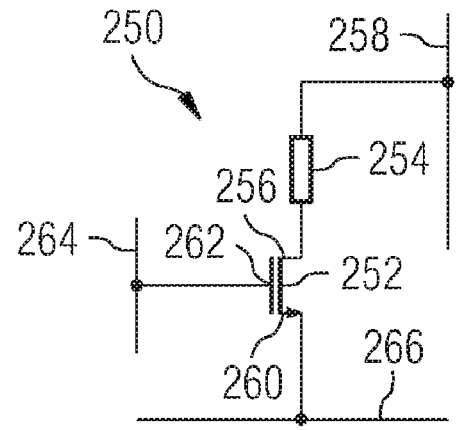

In the alternative configuration shown in FIG. 2B, the resistive memory element 254 is connected to a bit line 258, and to a source 256 of the select transistor 252. A drain 260 of the select transistor 252 is connected to a common line 266, which may be connected to ground, or to other circuitry (not shown), as discussed above. A gate 262 of the select transistor 252 is controlled by a word line 264.

One challenge for memory technologies is the limited packing density of memory cells. Increasing the packing density increases the number of memory cells that can be placed on a single device, and thus increases the amount of data that the device can store. Generally, the packing density can be increased by decreasing the scale of the memory cells. To meet the increasing demands for high capacity memory devices, use of memory cells with scaling dimensions below 50 nm may be desirable.

For TMO memories, as described above, the memory element itself may be scalable down to a diameter in the range of about 15 to about 20 nm. However, when integrated into a memory cell with a select transistor (as shown above) or a diode, this advantage is limited due to the dimensions of the transistor or diode and the integration scheme.

In accordance with some embodiments of the invention, the scale of a memory cell using a TMO memory element can be reduced by combining the TMO memory element with a select transistor having a 3-dimensional channel and buried gate. This combination may substantially reduce the dimensions of the memory cells, providing the possibility of increased density. Additionally, in some embodiments of the invention, use of such a buried gate select transistor may simplify the process scheme for the deposition of the TMO switching layer and subsequent integration.

FIG. 3 shows a memory cell in accordance with some embodiments of the invention. A memory cell 300 includes a buried gate select transistor 302 having a source region 304, a drain region 306, a gate oxide layer 308, and a gate 310 (which also serves as a word line). The drain region 306 is connected to a bottom contact 312, which connects to a switching layer 314. A top contact 316 is disposed above the switching layer 314, and connects to a bit line 318. The source region 304 connects to a common line 320.

The buried gate select transistor 302 is formed in a recess 322 in a surface of an active area of a substrate 324 that includes the source region 304 and drain region 306. The gate oxide layer 308 is formed lining the recess 322, and the gate 310 at least partially fills the recess 322. The gate oxide layer 308 includes an insulating material, such as $SiO_2$, and the gate 310 is formed of a conductive material, such as tungsten (W), though other conductive materials could be used.

The switching layer 314 may be a TMO layer, as described above. Alternatively, the switching layer 314 may include other materials to form a memory element that stores information by changing the resistivity or conductivity of the memory element. Examples of such resistive memory technologies include conductive bridging memory (CBRAM), phase change memory (PCRAM), magneto-resistive memory (MRAM), memory based on resistivity changes in carbon layers.

Use of the buried gate select transistor 302 permits the size of the memory cell to be reduced, increasing the density of memory cells on an integrated circuit memory device constructed in accordance with an embodiment of the invention.

The average size of a cell may be further reduced by arranging the cells so that the select transistors of at least two adjacent cells share a source or a drain region. FIG. 4 shows a schematic representation of the switching scheme for such an arrangement, in which the select transistors in two adjacent cells share a source region.

As can be seen, a memory cell 402 includes a transistor 404, having a source 406, a drain 408, and a gate 410. The memory cell 402 also includes a resistive memory element 412, such as a TMO-based resistive memory element, as described above, or another type of resistive element. The gate 410 of the transistor 404 is connected to a word line 414. The drain 408 of the transistor 404 is connected to the resistive memory element 412, which is connected to a bit line 416. The source 406 of the transistor 404 is connected to a common line 418.

In an adjacent memory cell 422, there is a similar resistive memory element 432, as well as a transistor 424 that includes a source 426, a drain 428, and a gate 430. The gate 430 of the transistor 424 is connected to a word line 434. The drain 428 of the transistor 424 is connected to the resistive memory element 432, which is connected to the bit line 416. The source 426 of the transistor 424 is connected to the common line 418.

Since the source 406 of the transistor 404 and the source 426 of the transistor 424 both connect to the common line 418, in some embodiments the transistors 404 and 424 may share a common source. This common source may be implemented in an integrated circuit by providing a shared source area for the two adjacent transistors, reducing the average size of the transistors, and the memory cells of which they are a part.

FIG. 5 shows a flow diagram of a high level method for manufacturing an integrated circuit including a memory cell such as is described above, in accordance with an embodiment of the invention. The method described with reference to FIG. 5 is for manufacturing an integrated circuit having cells that are arranged as described above with reference to FIG. 4, but a similar method could be used to produce cells having other arrangements.

In step 502, shallow trench isolation (STI) trenches are formed in a substrate on which a layer of nitride, such as silicon nitride ($Si_3N_4$) has been formed. Formation of the STI trenches is accomplished using known techniques, such as etching. The trenches are filled with an insulating material, such as $SiO_2$. The insulating material is then planarized, for example, using known chemical mechanical planarization (CMP) techniques.

In step 504, the buried gate select transistor is formed. This is done by forming a trench, for example, using lithographic techniques and reactive ion etching (RIE), though other known methods could also be used to form a trench in the $Si_3N_4$ layer and substrate. Once the trench has been formed, a gate oxide layer, including a material such as $SiO_2$ is grown lining the trench, and beneath the $Si_3N_4$ layer. Above the gate oxide layer, a gate is formed from a conductive material, such as tungsten (W). This can be done, for example, through chemical vapor deposition (CVD) of a layer of W, followed by planarization (e.g., through CMP) of the W layer. As described above, the gate may also serve as a word line.

Once the gate has been formed, it may be recessed slightly by, for example, use of RIE. The recess thus formed is filled with an insulating material, such as $SiO_2$, burying the gate and oxide layer. The insulating material is then planarized, for example, by a CMP process.

In step 506, source and drain implantation is carried out. First, the $Si_3N_4$ is stripped, using, for example, hot phosphoric acid. Source and drain regions are formed by n+ implantation in the case of an n-channel device, for example, by doping with arsenic (As) or by p+ in the case of a p-channel device, for example, by doping with boron (B), to an ion concentration of approximately $10^{15}/cm^2$. A mask is then applied to the surface, except over a contact area for the drain region. This contact area is opened by removing the $SiO_2$ over the contact area, for example, by using an etching technique such as RIE.

In step 508, the common line, attached to the source of the buried gate select transistor (as well as the source of the buried gate select transistor of at least one adjacent cell) is formed above the STI trench. This may be done by applying a mask, and removing some of the resistive material (e.g., $SiO_2$) from the STI trench, for example, by RIE. Selective silicon epitaxy above the STI may then be used to form a conductive silicon common source line within the STI trench.

Alternatively, the common source line can be formed by forming a recess in the STI trench, and depositing conductive poly silicon in the recess. The poly silicon is then planarized, for example, by CMP. An oxide (e.g., $SiO_2$) layer may be deposited above the poly silicon common source line.

In step 510, the bottom contact for the resistive memory element is formed over the drain portion of the buried gate select transistor. The bottom contact may be formed from poly silicon or other conductive materials. The bottom contact may be formed by using a stripe mask running parallel to the intended direction of the bit lines. Conductive poly silicon is then applied to form the bottom contacts. A $Si_3N_4$ hard mask is then applied in preparation for the next step.

In step 512, isolation trenches are formed, separating adjacent pairs of cells. The isolation trenches may be formed using a mask to determine the locations of the isolation trenches, and then etching the isolation trenches using known etching techniques. An insulating material, such as $SiO_2$ is then deposited to fill the isolation trenches, and is planarized (e.g., using CMP) down to the level of the $Si_3N_4$ that was deposited in the previous step. The $Si_3N_4$ may then be removed, using, for example, hot phosphoric acid.

In step 514, the memory layer stack of the resistive memory element is formed. This may be accomplished by forming a switching layer that stores information based on the resistivity of the switching layer. For a TMO resistive memory element, in accordance with an embodiment of the invention, the switching layer includes a TMO material, such as NiO, $TiO_2$, $HfO_2$, $ZrO_2$, $Nb_2O_5$, $Ta_2O_5$, or another suitable material. This material is deposited by means of reactive DC, MF, or RF sputtering of a metal (or compound) target in an Ar/oxygen mixture or a pure Ar working gas. A pressure of approximately 3 to 5 mbar and a sputter power at a power density of approximately 2 to 3.5 $W/cm^2$ may be used to deposit such TMO materials.

Next, a top contact is deposited above the switching layer. The top contact may be formed of a conductive material, such as platinum (Pt), palladium (Pd), titanium (Ti), or other metal or non-metal conductors. Generally, metals such as Pt, Pd, or Ti may be deposited by DC sputtering in an Ar working gas at pressures and powers similar to those used for depositing the TMO switching layer.

The memory layer stack is then shaped using, for example, a tantalum nitride (TaN) hard mask, which may be structured using a varnish mask. Once appropriate areas of the memory layer stack have been masked, unwanted material can be etched down to the $SiO_2$ that was previously deposited, using, for example, RIE.

In step 516, bit lines and bit line contacts are formed above the memory layer stack. To accomplish this, a relatively thick layer of $SiO_2$ is deposited (e.g., by CVD) over the device. A varnish mask is then applied to position the bit line contact holes. The contact holes are etched, and filled with a conductive material, such as titanium (Ti), titanium nitrate (TiN), or tungsten (W), though other metals or conductive materials may also be used. The $SiO_2$ layer and conductive material filling the contact holes are then planarized, for example, by CMP. Next, a conductive material, such as W, is deposited and patterned using, for example, a varnish mask and RIE, to form bit lines.

Although the above-described method discusses use of specific techniques, such as RIE for etching, or CMP for planarization, it will be recognized that there are other well known ways of carrying out the same or similar processes. For example, there are a variety of known techniques for etching. The specific techniques mentioned above are intended only as examples, and other techniques now known or hereafter developed may be used to carry out the same or similar processes.

Figure 6A:
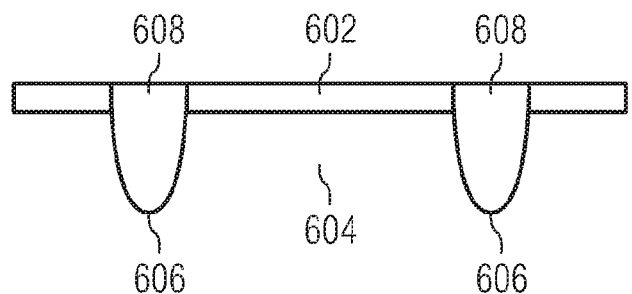

In the following figures, views of the integrated circuit after various intermediate steps of the above-described process are shown. In FIG. 6A, an integrated circuit memory device according to an embodiment of the invention is shown after deposition of an $Si_3N_4$ layer 602 on a substrate 604, and etching and filling of the STI trenches 606 with a resistive material 608, as described in step 502.

Figure 6B:
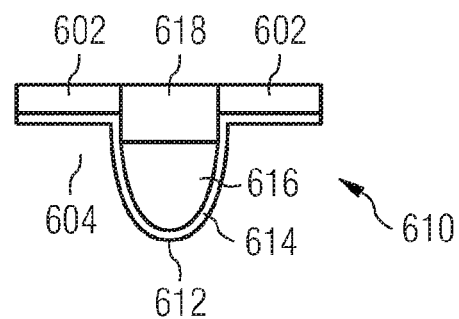

FIG. 6B shows a buried gate select transistor 610 after step 504. The buried gate select transistor 610 is formed in a trench 612 in the substrate 604. The trench 612 is formed, for example, using lithographic techniques and reactive ion etching (RIE), though other known methods could also be used to form a trench in the $Si_3N_4$ layer 602 and substrate 604. Next, a gate oxide layer 614, including a material such as $SiO_2$ is grown using, for example, conventional thermal techniques for oxide growth. Alternatively, the gate oxide layer 614 may be deposited. Above the gate oxide layer 614, a gate 616 is formed from a conductive material, such as tungsten (W). The gate material may also serve as a word line.

The gate 616 is recessed slightly by, for example, use of RIE. The recess thus formed is filled with an insulating material 618, such as $SiO_2$, burying the gate 616 and oxide layer 614. The insulating material 618 is planarized, for example, by a CMP process.

Figure 6C:
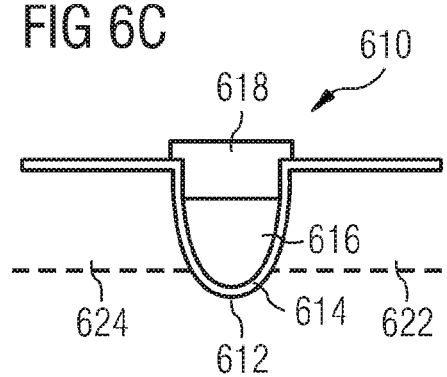

FIG. 6C shows the buried gate select transistor 610 during step 506. In FIG. 6C, the $Si_3N_4$ layer 602 has been stripped using hot phosphoric acid, leaving the insulating material 618. Additionally, a source region 622 and drain region 624 have been formed by N+ implantation.

Figure 6D:
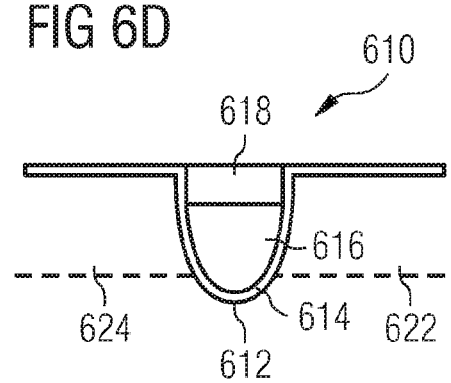
Figure 6E:
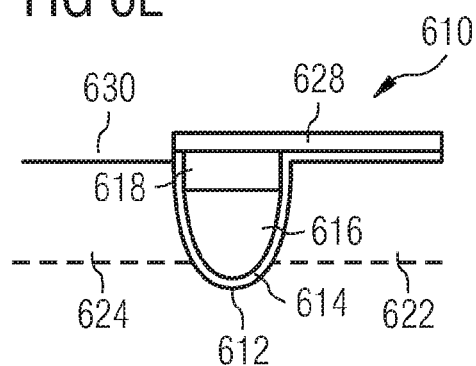

Next, as shown in FIG. 6D, the insulating material 618 are leveled using, for example, wet etch techniques. As shown in FIG. 6E, a mask 628 is applied to the surface, except over a contact area 630 for the drain region. The contact area 630 is opened by removing the $SiO_2$ over the contact area 630, for example, by using an etching technique such as RIE.

Figure 6F:
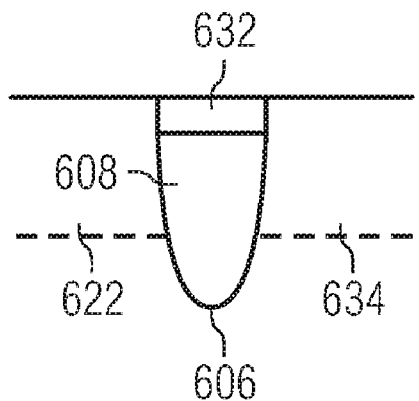

FIG. 6F shows the formation of a common source line 632 over an STI trench 606, as described in step 508. This common source line 632 is electrically connected to the source region 622, as well as a source region 634 of a select transistor of an adjacent cell (not shown). In one embodiment, the common source line 632 is formed by applying a mask (not shown), and removing some of the resistive material 608 (e.g., $SiO_2$) from the STI trench 606, for example, by RIE. Selective silicon epitaxy above the STI is then be used to form the conductive silicon common source line 632 within the STI trench 606.

Figure 6G:
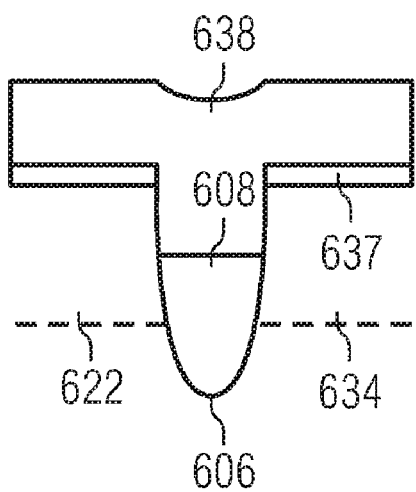
Figure 6H:
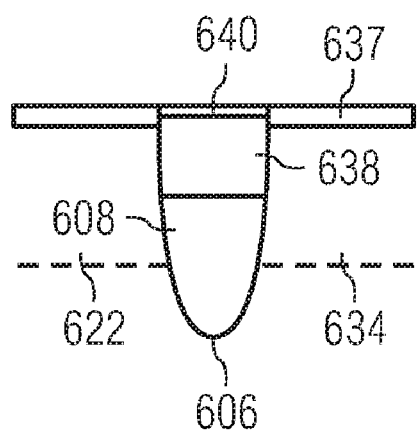

Alternatively, as shown in FIG. 6G, a common source line can be formed by forming a recess in the STI trench 606, and depositing a layer of conductive poly silicon 638 in the recess and over an oxide layer 637. As shown in FIG. 6H, the poly silicon 638 is planarized, for example by CMP, and an oxide (e.g., $SiO_2$) layer 640 is deposited above the poly silicon 638. In the alternative embodiment shown in FIGS. 6G and 6H, the poly silicon 638 serves as the common source line.

Figure 6I:
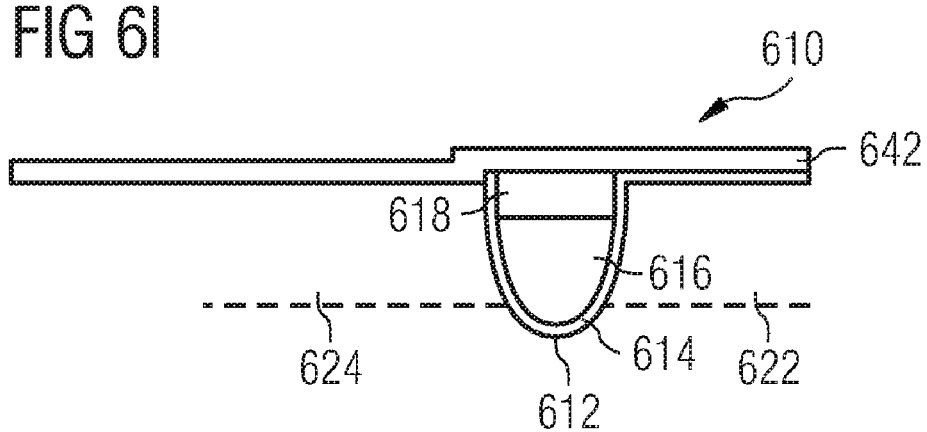

FIG. 6I shows a bottom contact 642 for the resistive memory formed over the drain region 624 of the buried gate select transistor 610, as described above in step 510. The bottom contact 642 may be formed from poly silicon or other conductive materials.

FIG. 6J shows the integrated circuit after step 512, in which an isolation trench 646 is formed. The isolation trench 646 may be formed using known masking and etching techniques. The isolation trench 646 is filled with an insulating material, such as $SiO_2$.

In FIG. 6K, the integrated circuit is shown after the formation of the memory layer stack, as described above in step 514. A switching layer 650 is deposited above the bottom contact 642. In some embodiments, the switching layer 650 may include a TMO material, such as NiO, $TiO_2$, $HfO_2$, $ZrO_2$, $Nb_2O_5$, $Ta_2O_5$, or another suitable material.

A top contact 652 is deposited above the switching layer 650. The top contact 652 may be formed of a conductive material, such as platinum (Pt), palladium (Pd), titanium (Ti), or other metal or non-metal conductors. Masking and etching down to the $SiO_2$ are used to shape the memory layer stack.

FIG. 6L shows bit lines and bit line contacts that are formed above the memory layer stack, as described in step 516. An $SiO_2$ layer 660 is deposited over the device, and masking and etching are used to form contact holes 662. The contact holes 662 are filled with a conductive material, such as titanium (Ti), titanium nitrate (TiN), or tungsten (W), though other metals or conductive materials may also be used. A bit line 664 is formed above the contact holes. The bit line 664 includes a conductive material, such as W.

Figure 7A:
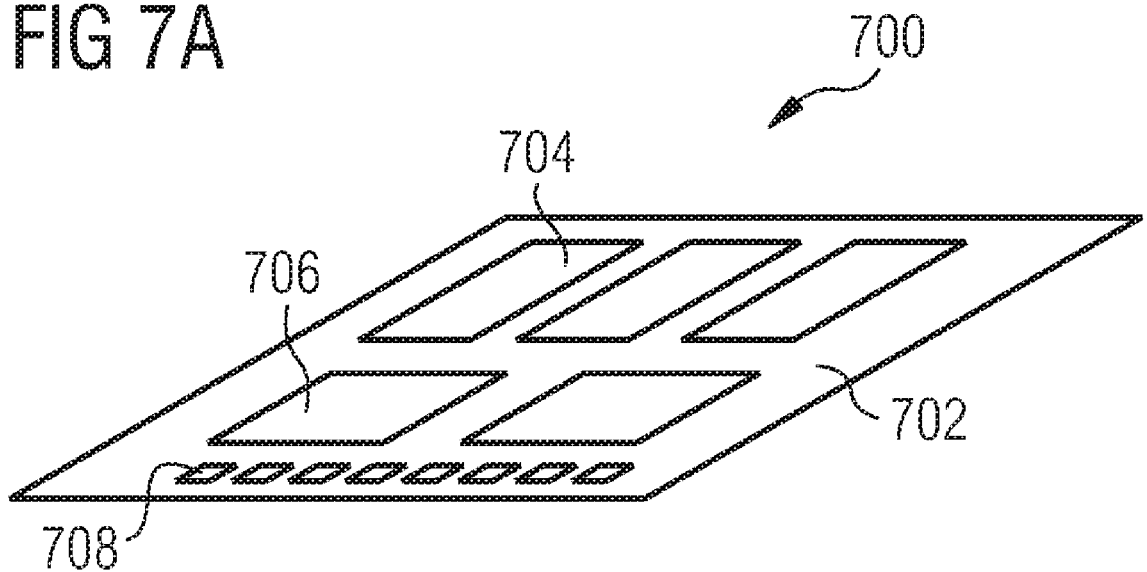
FIGS. 7A and 7B show a memory module and a stackable memory module, respectively, which may use memory cells in accordance with an embodiment of the invention.
Figure 7B:
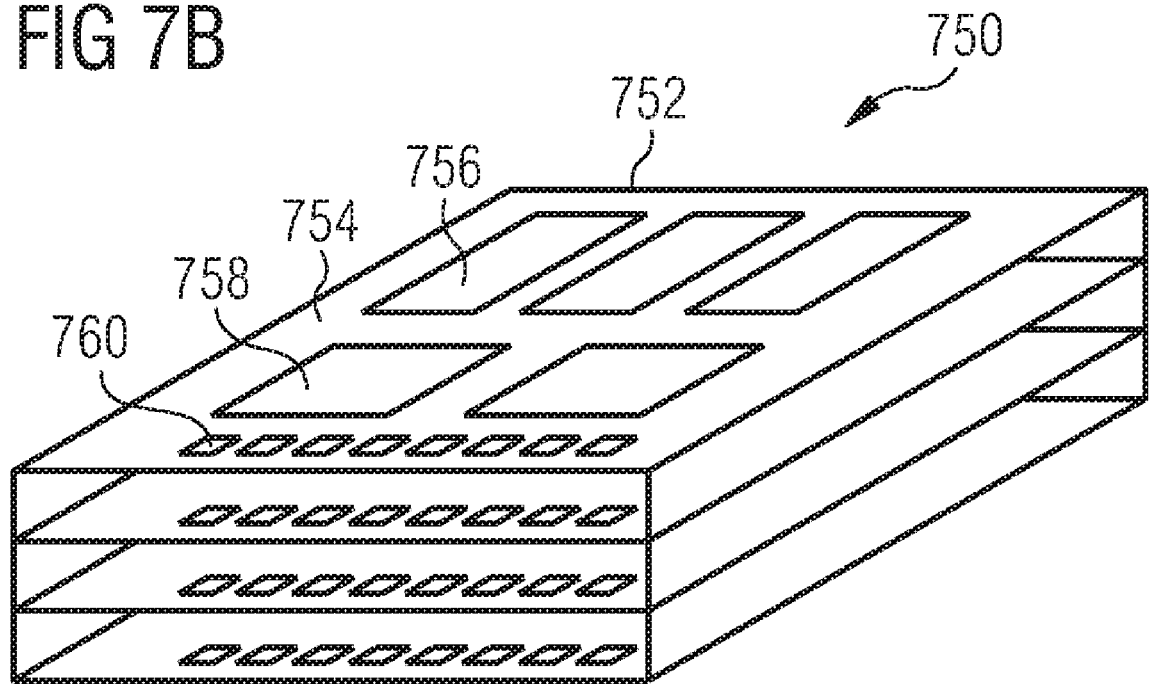

Memory cells such as are described above may be used in memory devices that contain large numbers of such cells. These cells may, for example, be organized into an array of memory cells having numerous rows and columns of cells, each of which stores one or more bits of information. Memory devices of this sort may be used in a variety of applications or systems. As shown in FIGS. 7A and 7B, in some embodiments, memory devices such as those described herein may be used in modules. In FIG. 7A, a memory module 700 is shown, on which one or more memory devices 704 are arranged on a substrate 702. Each memory device 704 may include numerous memory cells in accordance with an embodiment of the invention. The memory module 700 may also include one or more electronic devices 706, which may include memory, processing circuitry, control circuitry, addressing circuitry, bus interconnection circuitry, or other circuitry or electronic devices that may be combined on a module with a memory device 704. Additionally, the memory module 700 includes multiple electrical connections 708, which may be used to connect the memory module 700 to other electronic components, including other modules.

As shown in FIG. 7B, in some embodiments, these modules may be stackable, to form a stack 750. For example, a stackable memory module 752 may contain one or more memory devices 756, arranged on a stackable substrate 754. Each of the memory devices 756 contains memory cells that employ memory elements in accordance with an embodiment of the invention. The stackable memory module 752 may also include one or more electronic devices 758, which may include memory, processing circuitry, control circuitry, addressing circuitry, bus interconnection circuitry, or other circuitry or electronic devices that may be combined on a module with a memory device 756. Electrical connections 760 are used to connect the stackable memory module 752 with other modules in the stack 750, or with other electronic devices. Other modules in the stack 750 may include additional stackable memory modules, similar to the stackable memory module 752 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   a buried gate select transistor comprising a source region and a drain region; and
   a resistive memory element coupled to the buried gate select transistor, the resistive memory element storing information based on a resistivity of the resistive memory element, the resistive memory element comprising a stack of a plurality of layers, the stack comprising a bottom contact layer, a switching layer disposed above the bottom contact layer and a top contact layer disposed above the switching layer;
   a common line;
   wherein the drain region of the buried gate select transistor is in direct physical contact to the bottom contact layer of the stack of the resistive memory element; and
   wherein the source region of the buried gate select transistor is in direct physical contact to the common line
   wherein the buried gate select transistor comprises: a recess formed in an active area of a substrate, the active area comprising a source region and a drain region, the recess located between the source region and the drain region; a gate oxide layer lining the recess; and a gate comprising a conductive material at least partially filling the recess.

2. The integrated circuit of claim 1, wherein the resistive memory element comprises a transition metal oxide material.

3. The integrated circuit of claim 2, wherein the transition metal oxide material comprises a material selected from the group consisting of NiO, TiO2, HfO2, ZrO2, Nb2O5, and Ta2O5.

4. The integrated circuit of claim 1, wherein the resistive memory element comprises a switching layer that switches between a high resistance state and a low resistance state by reversibly forming a conductive filament within the switching layer.

5. A method of manufacturing an integrated circuit, the method comprising:
   forming a buried gate select transistor comprising a source region and a drain region; and
   forming a resistive memory element coupled to the buried gate transistor, the resistive memory element storing information based on a resistivity of the resistive memory element, the resistive memory element comprising a stack of a plurality of layers, the stack comprising a bottom contact layer, a switching layer disposed above the bottom contact layer and a top contact layer disposed above the switching layer
   directly contacting the drain region of the buried gate select transistor to the bottom contact layer, and
   forming a common line such that it is in direct physical contact to the source region of the buried gate select transistor wherein the buried gate select transistor comprises: a recess formed in an active area of a substrate, the active area comprising a source region and a drain region, the recess located between the source region and the drain region; a gate oxide layer lining the recess; and a gate comprising a conductive material at least partially filling the recess.

6. The method of claim 5, wherein forming the switching layer comprises depositing a transition metal oxide material.

7. The method of claim 6, wherein depositing the transition metal oxide material comprises depositing a material selected from the group consisting of NiO, TiO2, HfO2, ZrO2, Nb2O5, and Ta2O5.

8. The method of claim 5, further comprising forming a bit line electrically coupled to the resistive memory element.

9. An integrated circuit comprising:
   a buried gate select transistor, the buried gate select transistor comprising a trench formed in a substrate, a gate oxide layer lining the trench, a gate at least partially filling the trench, a source region and a drain region; and
   a resistive memory element disposed above the buried gate select transistor, the resistive memory element comprising a stack of a plurality of layers, the stack comprising a bottom contact layer, a switching layer disposed above the bottom contact layer and a top contact layer disposed above the switching layer;
   a common line;
   wherein the drain region of the buried gate select transistor is in direct physical contact to the bottom contact layer of the stack of the resistive memory element; and
   wherein the source region of the buried gate select transistor is in direct physical contact to the common line.

10. The integrated circuit of claim 9, wherein the resistive memory element comprises a transition metal oxide material.

11. The integrated circuit of claim 9, wherein the resistive memory element comprises a switching layer that switches between a high resistance state and a low resistance state by reversibly forming a conductive filament within the switching layer.

12. A memory module comprising:
   a plurality of integrated circuits that are electrically coupled to one another, wherein the integrated circuits each comprise a memory cell comprising a buried gate select transistor comprising a source region and a drain region and a resistive memory element coupled to the buried gate select transistor, the resistive memory element storing information based on a resistivity of the resistive memory element, the resistive memory element comprising a stack of a plurality of layers, the stack comprising a bottom contact layer, a switching layer disposed above the bottom contact layer and a top contact layer disposed above the switching layer;
   a common line;
   wherein the drain region of the buried gate select transistor is in direct physical contact to the bottom contact layer of the stack of the resistive memory element; and
   wherein the source region of the buried gate select transistor is in direct physical contact to the common line wherein the buried gate select transistor comprises: a recess formed in an active area of a substrate, the active area comprising the source region and the drain region, the recess located between the source region and the drain region; a gate oxide layer lining the recess; and a gate comprising a conductive material at least partially filling the recess.

13. The memory module of claim 12, wherein the restive memory element comprises a transition metal oxide material.

14. The memory module of claim 12, wherein the resistive memory element comprises a switching layer that switches between a high resistance state and a low resistance state by reversibly forming a conductive filament within the switching layer.

* * * * *